(12) United States Patent
Lippert et al.

(10) Patent No.: US 11,187,990 B2
(45) Date of Patent: Nov. 30, 2021

(54) MIRROR FOR A MICROLITHOGRAPHIC PROJECTION EXPOSURE APPARATUS, AND METHOD FOR OPERATING A DEFORMABLE MIRROR

(71) Applicant: Carl Zeiss SMT GmbH, Oberkochen (DE)

(72) Inventors: Johannes Lippert, Buch am Wald (DE); Toralf Gruner, Aalen (DE); Kerstin Hild, Waldstetten (DE); Philip Lucke, Luenen (DE); Mohammadreza Nematollahi, Eindhoven (NL)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/158,083

(22) Filed: Jan. 26, 2021

(65) Prior Publication Data

US 2021/0149310 A1    May 20, 2021

Related U.S. Application Data

(63) Continuation of application No. PCT/EP2019/066634, filed on Jun. 24, 2019.

(30) Foreign Application Priority Data

Jul. 26, 2018    (DE) .................. 10 2018 212 508.2

(51) Int. Cl.
*H01L 41/187*    (2006.01)
*G03F 7/20*    (2006.01)
(Continued)

(52) U.S. Cl.
CPC ....... *G03F 7/70266* (2013.01); *G02B 5/0891* (2013.01); *G03F 7/70316* (2013.01);
(Continued)

(58) Field of Classification Search
CPC ............ G03F 7/70266; G03F 7/70316; G02B 5/0891; H01L 41/0815; H01L 41/0986; H01L 41/1876
(Continued)

(56) References Cited

U.S. PATENT DOCUMENTS

| 2012/0218498 A1 | 8/2012 | Bonora et al. |
| 2014/0285783 A1 | 9/2014 | Dinger et al. |

(Continued)

FOREIGN PATENT DOCUMENTS

| DE | 102011005940 A1 | 9/2012 |
| DE | 102011081603 A1 | 10/2012 |

(Continued)

OTHER PUBLICATIONS

Ishikiriyama et al. "Improvement of Self-sensing Piezoelectric Actuator Control Using Permittivity Change Detection", Journal of Advanced Mechanical Design, Systems, and Manufacturing, vol. 4, No. 1, 2010, 7 pages.
(Continued)

*Primary Examiner* — Hung Nguyen
(74) *Attorney, Agent, or Firm* — Edell, Shapiro & Finnan LLC

(57) ABSTRACT

A mirror for a microlithographic projection exposure apparatus, and a method for operating a deformable mirror. In one aspect, a mirror includes an optical effective surface (11), a mirror substrate (12), a reflection layer stack (21) for reflecting electromagnetic radiation incident on the optical effective surface, and at least one piezoelectric layer (16) arranged between the mirror substrate and the reflection layer stack and to which an electric field for producing a locally variable deformation is able to be applied by a first electrode arrangement situated on the side of the piezoelectric layer (16) facing the reflection layer stack, and by a
(Continued)

second electrode arrangement situated on the side of the piezoelectric layer facing the mirror substrate. The piezoelectric layer has a plurality of columns spatially separated from one another by column boundaries, wherein a mean column diameter of the columns is in the range of 0.1 µm to 50 µm.

15 Claims, 10 Drawing Sheets

(51) Int. Cl.
*G02B 5/08* (2006.01)
*H01L 41/08* (2006.01)
*H01L 41/09* (2006.01)

(52) U.S. Cl.
CPC ...... *H01L 41/0815* (2013.01); *H01L 41/0986* (2013.01); *H01L 41/1876* (2013.01)

(58) Field of Classification Search
USPC .......................................................... 355/67
See application file for complete search history.

(56) References Cited

U.S. PATENT DOCUMENTS

| | | |
|---|---|---|
| 2014/0340001 A1 | 11/2014 | Jung |
| 2015/0092172 A1 | 4/2015 | Sai et al. |
| 2016/0209751 A1* | 7/2016 | Gruner ................ G02B 5/0816 |
| 2016/0341956 A1 | 11/2016 | Yasuda |
| 2018/0123017 A1* | 5/2018 | Fujii .................... H01L 41/094 |

FOREIGN PATENT DOCUMENTS

| | | |
|---|---|---|
| DE | 102011077234 A1 | 12/2012 |
| DE | 102011081161 A1 | 2/2013 |
| DE | 102011084649 A1 | 4/2013 |
| DE | 102013219583 A1 | 4/2015 |
| DE | 102015213273 A1 | 1/2017 |
| DE | 102016224202 A1 | 1/2017 |
| DE | 102017203647 A1 | 9/2018 |
| WO | 2013057046 A1 | 4/2013 |

OTHER PUBLICATIONS

German Office Action with English translation, DE102018212508.2, dated Mar. 18, 2019, 15 pages.
International Preliminary Report on Patentability, PCT/EP2019/066634, dated Jan. 26, 2021, 12 pages.
Kai Ortner et al., "Influence of Bias Voltage on the Structure of Lead Zirconate Tifanate Piezoelectric Films prepared by Gas Flow Sputtering", Plasma Processes and Polymers, vol. 4, No. S1, Apr. 1, 2007, pp. S134-S138.
Wang et al., "Precision tracking collrol of piezoelectric actuator based on Bouc-Wen hysteresis compensator", Electroinics Letters, IEE Stevenage, GB, vol. 48, No. 23, Nov. 8, 2012, pp. 1459-1460.
Maiwa et al., "Measurement and calculation of PZT thin film longitudinal piezoelectric coefficients", Integrated Ferroelectrics, Taylor & Francis, US, vol. 24, No. 1-4, Jan. 1, 1999, pp. 139-146.
International Search Report, PCT/EP2019/066634, dated Oct. 10, 2019, 6 pages.

* cited by examiner

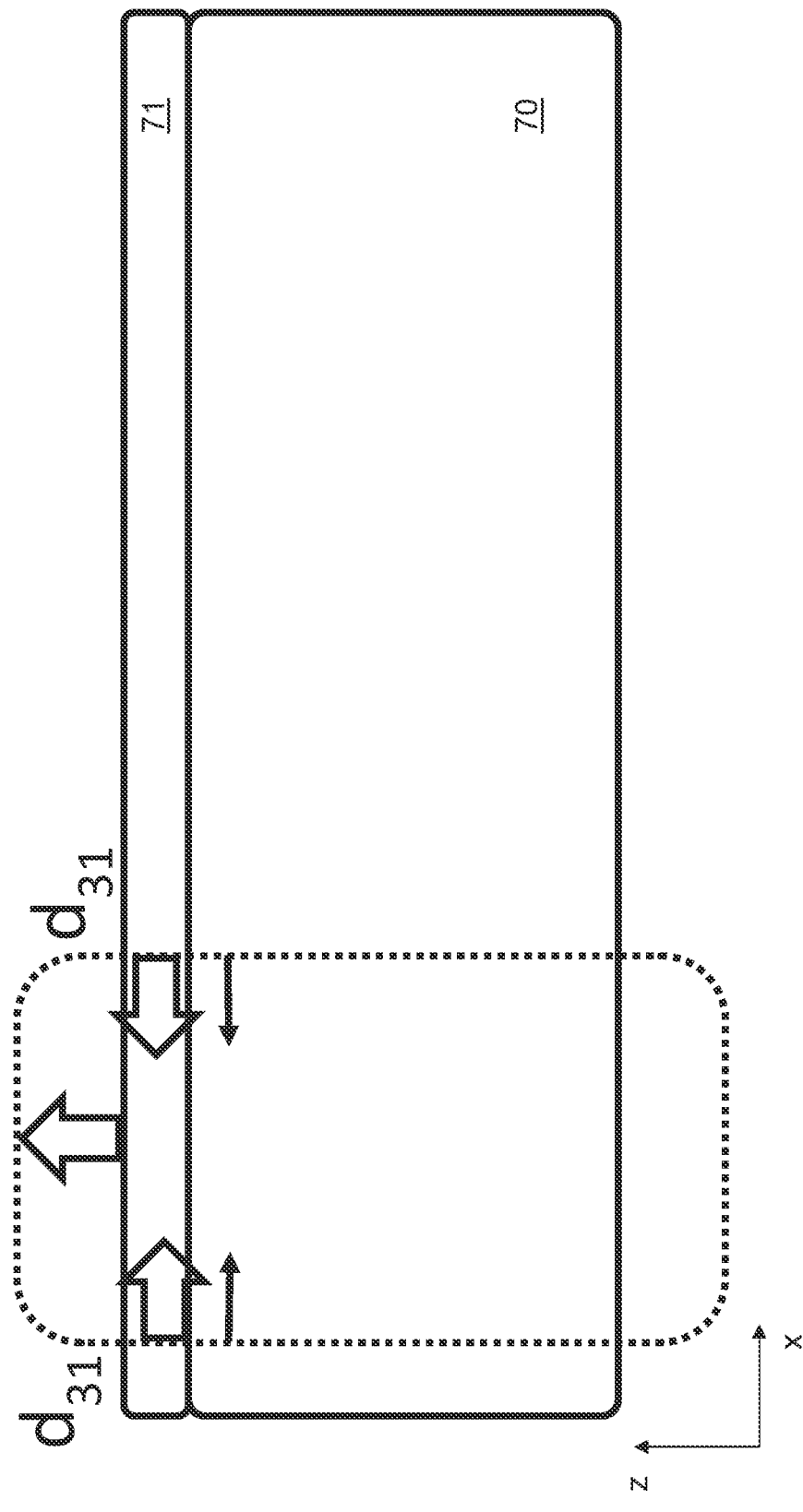

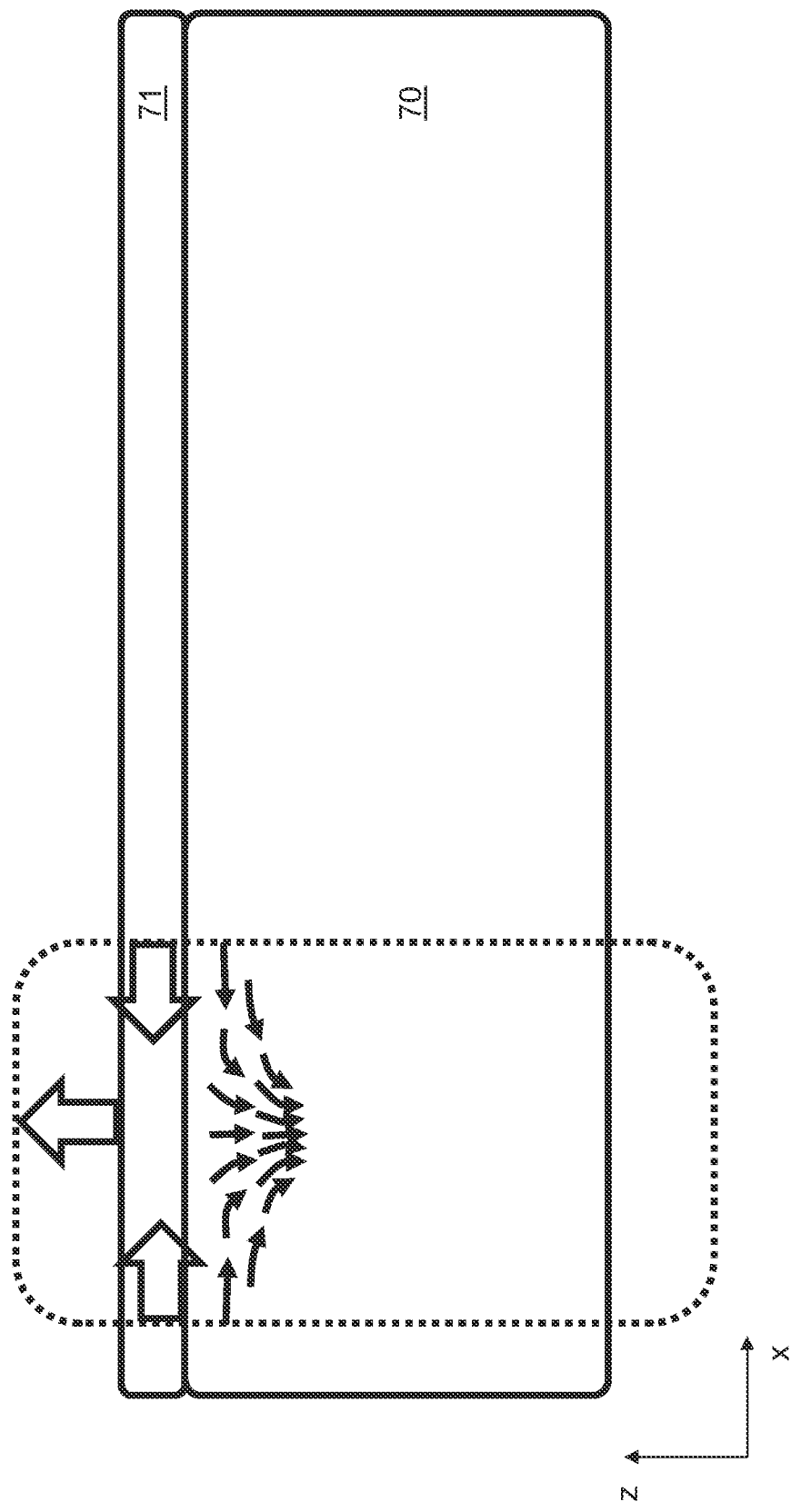

MIRROR FOR A MICROLITHOGRAPHIC PROJECTION EXPOSURE APPARATUS, AND METHOD FOR OPERATING A DEFORMABLE MIRROR

CROSS REFERENCE TO RELATED APPLICATIONS

This is a Continuation of International Application PCT/EP2019/066634, which has an international filing date of Jun. 24, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 212 508.2 filed on Jul. 26, 2018.

FIELD OF THE INVENTION

The invention relates to a mirror for a microlithographic projection exposure apparatus, and to a method for operating a deformable mirror.

BACKGROUND

Microlithography is used for producing microstructured components such as, for example, integrated circuits or LCDs. The microlithography process is conducted in a so-called projection exposure apparatus, which comprises an illumination device and a projection lens. The image of a mask (=reticle) illuminated with the illumination device is projected with the projection lens onto a substrate (e.g. a silicon wafer) coated with a light-sensitive layer (=photoresist) and disposed in the image plane of the projection lens, in order to transfer the mask structure to the light-sensitive coating of the substrate.

In projection lenses designed for the extreme ultraviolet (EUV) range, i.e., at wavelengths of, e.g., approximately 13 nm or approximately 7 nm, mirrors are used as optical components for the imaging process owing to the lack of availability of suitable light-transmissive refractive materials.

In this case, it is also known to configure one or more mirrors in an EUV system as an adaptive mirror with an actuator layer composed of a piezoelectric material, wherein an electric field having a locally varying strength is generated across this piezoelectric layer by an electrical voltage being applied to electrodes arranged on both sides with respect to the piezoelectric layer. In the case of a local deformation of the piezoelectric layer, the reflection layer stack of the adaptive mirror also deforms, with the result that, for example, imaging aberrations (possibly also temporally variable imaging aberrations) can be at least partly compensated for by suitably driving the electrodes.

With regard to the abovementioned piezoelectric layer used to compensate for optical aberrations it is desirable, in principle, for a specific electrical voltage applied to the electrodes also to result in each case predictively in the proportional and highest possible deformation of the piezoelectric layer and thus of the reflection layer stack of the adaptive mirror. The coefficient that characterizes the linear expansion of the material of the piezoelectric layer that is obtained in a voltage-dependent manner is also referred to as the $d_{33}$ coefficient, and corresponds to the relevant component of the dielectric tensor that is responsible for the linear expansion in a direction perpendicular to the optical effective surface.

One associated practical problem that arises, however, is that the above-described linear expansion in a direction perpendicular to the optical effective surface, in the case of the (substantially volume-preserving) piezoelectric material, results in the contraction thereof in a lateral reaction, wherein this effect can be described by the $d_{31}$ coefficient or the corresponding component of the dielectric tensor.

The above-described effect is elucidated in the schematic illustrations in FIGS. 7A-7E, where the mirror substrate is designated by "70" and the piezoelectric layer by "71" (wherein the illustration of further functional layers has been dispensed with here for the sake of simplicity). The mechanical stress (FIG. 7C) built up in a lateral direction within the piezoelectric layer 71 upon application of an electric field (FIG. 7B) is transferred in turn to the fixedly attached mirror substrate 70 (which is comparatively more compliant or softer relative to the piezoelectric layer 71) (FIG. 7C) with the consequence that the mirror substrate 70 yields toward the direction facing away from the piezoelectric layer 71 (FIG. 7D). As indicated in FIG. 7E, the above-described effect ultimately results in indentation of the piezoelectric layer 71 into the mirror substrate 70 and ultimately has the undesirable effect that the total figure effect resulting from the application of the electric field is correspondingly reduced in comparison with the linear expansion described by the $d_{33}$ coefficient.

A further associated practical problem is that the setting accuracy that is ultimately achievable with an adaptive mirror having e.g. the construction shown in FIG. 1 is limited by hysteresis effects occurring within the piezoelectric layer 16. "Hysteresis" here is taken to mean that the deflection (corresponding to the "travel" of the piezoelectric layer in a direction perpendicular to the optical effective surface) ultimately achieved for a specific value of the applied electrical voltage is dependent on the history, in other words cyclic progression through a voltage range (e.g. in accordance with the diagram illustrated in FIG. 5) results in different values of the deflection or travel for "outgoing path" and "return path" with respect to the values of the applied electrical voltage.

Overall, therefore, the realization of sufficiently large deflections in conjunction with a high setting accuracy of an adaptive mirror presents a demanding challenge in practice.

Regarding the prior art, reference is made merely by way of example to DE 10 2013 219 583 A1 and DE 10 2015 213 273 A1.

SUMMARY

It is an object of the present invention to provide a mirror for a microlithography projection exposure apparatus and a method for operating a deformable mirror which make it possible to realize sufficiently large deflections in conjunction with a high setting accuracy.

This object and related objects are achieved in accordance with the novel structures and methods described and claimed hereinbelow.

A mirror according to one aspect of the invention for a microlithography projection exposure apparatus, wherein the mirror has an optical effective surface, comprises:
- a mirror substrate,
- a reflection layer stack for reflecting electromagnetic radiation that is incident on the optical effective surface, and
- at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate, wherein said piezoelectric layer has a plurality of columns spatially separated from one another by column boundaries, wherein a mean column diameter of said columns is in the range of 0.1 µm to 50 µm.

In accordance with one embodiment, the mean column spacing of columns respectively adjacent to one another is in the range of 2% to 30% of the mean column diameter.

The invention proceeds firstly from the observation that the piezoelectric layer which is present in an adaptive mirror and to which an electric field for producing a locally variable deformation is able to be applied is typically not perfectly homogeneous, but rather is constructed in a kind of "column structure" composed of a multiplicity of crystalline columns depending on the respective fabrication process.

Proceeding from this insight, the invention makes use of the concept, in particular, of choosing the mean column diameter of said columns in a suitable way so as to achieve the best possible compromise between the travel that can be realized with the adaptive mirror, on the one hand, and the achievable setting accuracy, on the other hand.

As far as firstly the travel or the linear expansion in a direction perpendicular to the optical effective surface is concerned, the invention proceeds from the consideration that the effect of the indentation of the piezoelectric layer into the mirror substrate as described in the introduction (i.e. the abovementioned "indentation effect") can be reduced or largely eliminated in principle by resorting to the smallest possible value of the mean column diameter. This can be explained by the fact that when the piezoelectric layer is composed of comparatively small columns (e.g. having a mean diameter in the region of 0.5 µm), said columns exhibit largely free mobility in a lateral direction and, consequently, no appreciable mechanical stresses that might cause indentation of the piezoelectric layer into the mirror substrate are transmitted between adjacent columns.

As far as, on the other hand, the setting accuracy achievable with the adaptive mirror is concerned, the invention proceeds from the consideration that conversely a comparatively larger value of the mean column diameter is advantageous with regard to the hysteresis effect—likewise described in the introduction—that limits said setting accuracy. This circumstance is attributable to the fact that said hysteresis effect is caused in part by friction effects occurring between adjacent columns or at the column boundaries and is thus particularly pronounced if a particularly large number of friction surfaces are present within the piezoelectric layer on account of a small mean column diameter.

As a result, then, proceeding from the above considerations, the invention includes the principle of choosing a suitable compromise value or range of values for the mean column diameter such that both the travel achieved with the adaptive mirror and the achievable setting accuracy can fulfill the specification respectively required therefor.

In accordance with one embodiment, a ratio between the mean column diameter and the height of the columns is in the range of 50:1 to 1:200, in particular in the range of 10:1 to 1:10.

The invention furthermore relates to a mirror for a microlithographic projection exposure apparatus, wherein the mirror has an optical effective surface, comprising:

a mirror substrate, a reflection layer stack for reflecting electromagnetic radiation that is incident on the optical effective surface, and at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate, wherein said piezoelectric layer has a plurality of columns spatially separated from one another by column boundaries, wherein a mean column spacing of said columns is in the range of 2% to 30% of the mean column diameter.

The invention furthermore relates to a mirror for a microlithographic projection exposure apparatus, wherein the mirror has an optical effective surface, comprising:

a mirror substrate, a reflection layer stack for reflecting electromagnetic radiation that is incident on the optical effective surface, and at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate, wherein said piezoelectric layer has a plurality of columns spatially separated from one another by column boundaries, wherein a ratio between the mean column diameter and the height of the columns is in the range of 50:1 to 1:200, in particular in the range of 10:1 to 1:10.

In accordance with one embodiment, the piezoelectric layer has at least two regions which differ from one another by at least 30% with regard to the mean column diameter.

In embodiments of the invention, in this case said two regions can correspond to different layer plies of the piezoelectric layer, wherein a first layer ply of said layer plies is arranged closer to the mirror substrate than a second layer ply of said layer plies.

Preferably, in this case the first layer ply has the region with the smaller mean column diameter. This configuration has the advantage that, on account of the comparatively smaller mean column diameter relative to the second layer ply, said first layer ply acts in a relatively flexible way and thus reduces the mechanical coupling in the direction of the layer stack between the second layer ply, having the comparatively larger mean column diameter, and the mirror substrate. At the same time, a reduced hysteresis contribution can be achieved by way of the second layer ply on account of the smaller number of column boundaries there.

In further embodiments of the invention, the two regions having mutually different mean column diameters can also constitute regions which are situated within one and the same layer ply of the piezoelectric layer and which are laterally separated from one another. This configuration can take account of the circumstance that the adaptive mirror typically contains regions in which, for instance, the disadvantageous effect of the "indentation effect" described above is manifested to different extents, such that according to the invention, for instance, in regions where this indentation effect is manifested to a comparatively lesser extent on account of greater "static determinacy" (which regions may be, merely by way of example, edge regions and/or regions of the mirror which are mechanically supported by components such as bushes or the like), the mean column diameter can be chosen to be correspondingly larger in order in this respect to achieve a greater restriction of the hysteresis effect and thus a greater setting accuracy.

The invention furthermore relates to a mirror for a microlithographic projection exposure apparatus, wherein the mirror has an optical effective surface, comprising:
- a mirror substrate;
- a reflection layer stack for reflecting electromagnetic radiation that is incident on the optical effective surface; and
- at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate;
- wherein said piezoelectric layer has a plurality of columns spatially separated from one another by column boundaries;
- wherein the piezoelectric layer has at least two regions which differ from one another by at least 30% with regard to the mean column diameter.

In accordance with one embodiment, the piezoelectric layer has at least two regions which differ from one another by at least 40%, more particularly by at least 50%, with regard to the mean column diameter.

In accordance with one embodiment, the piezoelectric layer has at least two regions which differ from one another by at least 10%, in particular by at least 20%, with regard to the mean column spacing.

The invention furthermore relates to a mirror for a microlithographic projection exposure apparatus, wherein the mirror has an optical effective surface, comprising:
- a mirror substrate;
- a reflection layer stack for reflecting electromagnetic radiation that is incident on the optical effective surface; and
- at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate;
- wherein said piezoelectric layer has a plurality of columns spatially separated from one another by column boundaries;
- wherein the piezoelectric layer has at least two regions which differ from one another by at least 10%, in particular by at least 20%, with regard to the mean column spacing.

In other applications, a mirror according to the invention can also be employed or utilized for example in an apparatus for mask metrology.

In accordance with one embodiment, the mirror is designed for an operating wavelength of less than 30 nm, in particular less than 15 nm. However, the invention is not restricted thereto, and so in further applications the invention can also be realized advantageously in an optical system having an operating wavelength in the VUV range (e.g. of less than 200 nm).

The invention furthermore also relates to a method for operating a deformable mirror, wherein the mirror comprises:
- a mirror substrate,
- a reflection layer stack for reflecting electromagnetic radiation that is incident on an optical effective surface of the mirror, and
- at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate,
wherein the method comprises the following steps:
- determining an expected hysteresis contribution to the deformation behavior of the mirror, wherein on account of said hysteresis contribution the linear expansion of the piezoelectric layer along the surface normal to the optical effective surface when a predefined voltage distribution U(x,y) is applied to the first electrode arrangement and/or the second electrode arrangement deviates from the product of the relevant linear expansion coefficient $d_{33}$ (x,y) of the piezoelectric layer and the respective value of the electrical voltage; and
- applying a modified voltage distribution to the first electrode arrangement and/or the second electrode arrangement so that said hysteresis contribution is at least partly compensated for.

In accordance with one embodiment, the expected hysteresis contribution is determined in a model-based manner after the hysteresis behavior of the mirror has been measured beforehand.

In accordance with one embodiment, the expected hysteresis contribution is determined on the basis of a measurement of the electrical permittivity of the piezoelectric layer.

In accordance with one embodiment, the method comprises the step of applying an electrical bias voltage to the first electrode arrangement and/or the second electrode arrangement.

In accordance with one embodiment, a unipolar alternating electric field is generated along the direction of the surface normal to the optical effective surface before the mirror is started up or/and during at least one operating pause for the purpose of aligning Weiss domains in the piezoelectric layer.

The invention furthermore relates to a method for operating a deformable mirror, wherein the mirror comprises:
- a mirror substrate,
- a reflection layer stack for reflecting electromagnetic radiation that is incident on an optical effective surface of the mirror, and
- at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate, wherein a unipolar alternating electric field is generated along the direction of the surface normal to the optical effective surface before the mirror is started up or/and during at least one operating pause for the purpose of aligning Weiss domains in the piezoelectric layer.

The frequency of the unipolar alternating electric field can be e.g. in an interval of 1 MHz to 100 MHz.

The invention furthermore relates to an illumination device or a projection lens of a microlithography projection exposure apparatus, comprising at least one mirror having the features described above, and also to a microlithography projection exposure apparatus.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIG. 7C shows a schematic illustration of building up a mechanical stress within the piezoelectric layer in the adaptive mirror of FIG. 7A;

FIG. 7D shows a schematic illustration of a yielding of the mirror substrate toward the direction facing away from the piezoelectric layer in the adaptive mirror of FIG. 7A.

DETAILED DESCRIPTION

Figure 1:
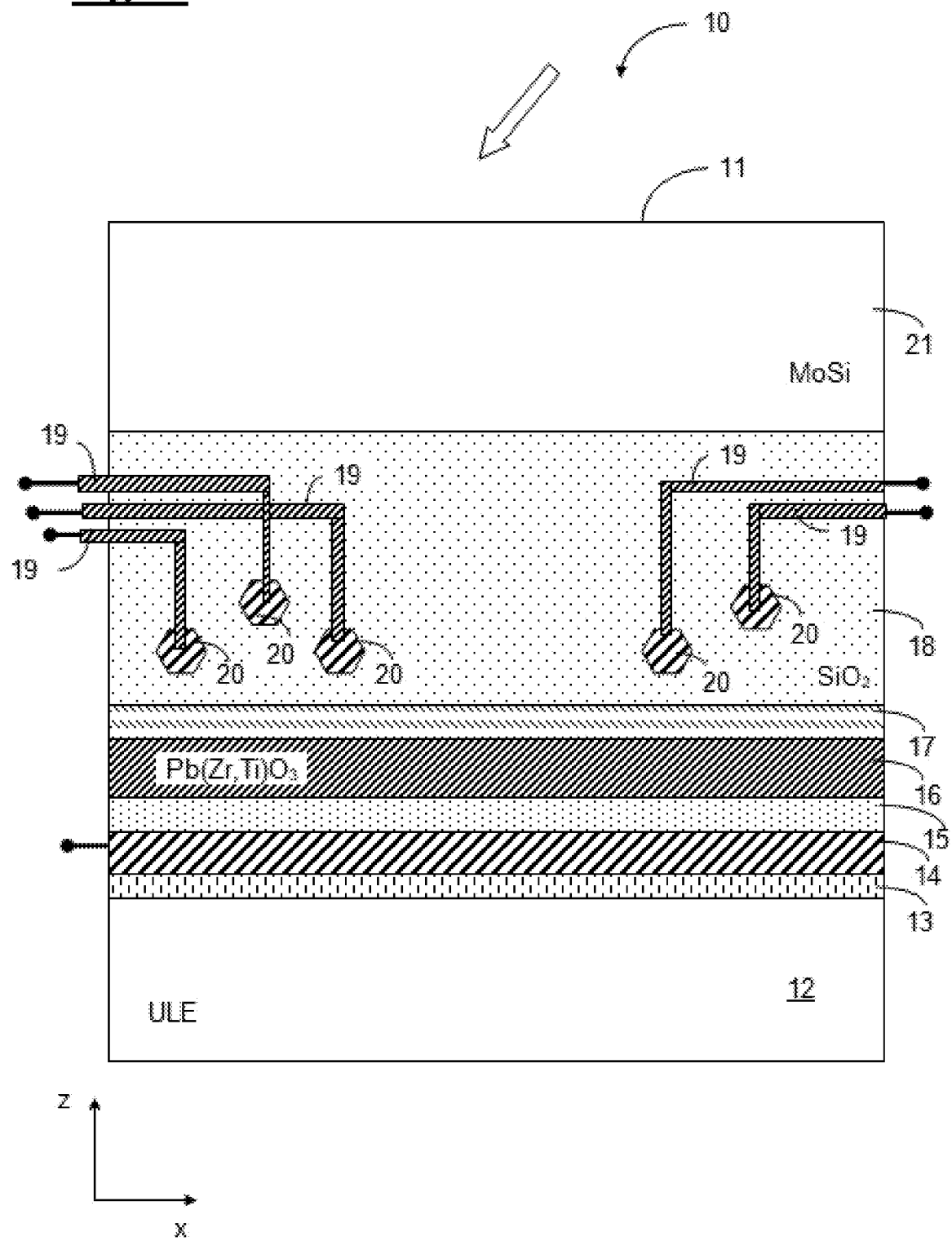
FIG. 1 shows a schematic illustration for describing the construction of an adaptive mirror in accordance with one embodiment of the invention.

FIG. 1 shows a schematic illustration for elucidating the exemplary construction of a mirror according to the invention. The mirror 10 comprises in particular a mirror substrate 12, which is produced from any desired suitable mirror substrate material. Suitable mirror substrate materials are e.g. quartz glass doped with titanium dioxide ($TiO_2$), with materials that are usable being, merely by way of example (and without the invention being restricted thereto), those sold under the trade names ULE® (from Corning Inc.) or Zerodur® (from Schott A G). Furthermore, the mirror 10 has, in a manner known per se in principle, a reflection layer stack 21, which, in the embodiment illustrated, comprises merely by way of example a molybdenum-silicon (Mo—Si) layer stack. Without the invention being restricted to specific configurations of this layer stack, one suitable construction that is merely by way of example can comprise approximately 50 plies or layer packets of a layer system comprising molybdenum (Mo) layers having a layer thickness of in each case 2.4 nm and silicon (Si) layers having a layer thickness of in each case 3.3 nm.

The mirror 10 can be in particular an EUV mirror of an optical system, in particular of the projection lens or of the illumination device of a microlithographic projection exposure apparatus.

The impingement of electromagnetic EUV radiation (indicated by an arrow in FIG. 1) on the optical effective surface 11 of the mirror 10 during operation of the optical system can have the consequence of an inhomogeneous volume change of the mirror substrate 12 on account of the temperature distribution which results from the absorption of radiation that is incident inhomogeneously on the optical effective surface 11. In order to correct such an undesired volume change or else in order to correct other aberrations that occur during operation of the microlithographic projection exposure apparatus, the mirror 10 is of adaptive design, as is explained in greater detail below. For this purpose, the mirror 10 according to the invention has a piezoelectric layer 16, which is produced from lead zirconate titanate (Pb(Zr,Ti)$O_3$, PZT) in the exemplary embodiment. In further embodiments, the piezoelectric layer 16 can also be produced from some other suitable material (e.g. aluminum nitride (AlN), aluminum scandium nitride (AlScN), lead magnesium niobate (PbMgNb) or vanadium-doped zinc oxide (ZnO)). The piezoelectric layer 16 can have for example a thickness of less than 5 µm, more particularly a thickness in the range of 1 µm to 4 µm. In embodiments, the performance of the piezoelectric layer 16 can be increased by a calcium niobate layer (CaNbO$_3$ layer) being introduced at a suitable location of the layer stack. The increase in performance is achieved here by the piezoelectric layer 16 preferably growing in the [001] crystal direction.

Electrode arrangements are respectively situated above and below the piezoelectric layer 16, by way of which electrode arrangements an electric field for producing a locally variable deformation is able to be applied to the mirror 10. Of said electrode arrangements, the second electrode arrangement facing the mirror substrate 12 is configured as a continuous, planar electrode 14 of constant thickness, whereas the first electrode arrangement has a plurality of electrodes 20, to each of which an electrical voltage relative to the electrode 14 is able to be applied by way of a respective lead 19. The electrodes 20 are embedded into a common smoothing layer 18, which is produced e.g. from quartz (SiO$_2$) and serves for leveling the electrode arrangement formed from the electrodes 20.

Furthermore, the mirror 10 in accordance with FIG. 1 comprises an optional adhesion layer 13 (in the example composed of titanium, Ti) between the mirror substrate 12 and the bottom electrode 14 facing the mirror substrate 12. Furthermore, "15" denotes a buffer layer present between the electrode 14 facing the mirror substrate 12 and the piezoelectric layer 16. Said buffer layer 15 serves to further support the growth of PZT in an optimum, crystalline structure and to ensure consistent polarization properties of the piezoelectric layer 16 over the service life, and can be produced e.g. from LaNiO$_3$.

In accordance with FIG. 1, the mirror 10 furthermore has a mediator layer 17. Said mediator layer 17 is in direct electrical contact with the electrodes 20 (which are illustrated in plan view in FIG. 1 only for illustrative purposes). Said mediator layer 17 serves to "mediate" between the electrodes 20 in terms of potential, wherein it has only low electrical conductivity (preferably less than 200 siemens/meter (S/m)), with the consequence that a potential difference existing between adjacent electrodes 20 is dropped substantially across the mediator layer 17.

During operation of the mirror 10 or of an optical system comprising said mirror 10, applying an electrical voltage to the electrodes 14, 20, by way of the electric field that forms in the region of the piezoelectric layer 16, results in a deflection of said piezoelectric layer 16. In this way, it is possible to achieve an actuation of the mirror 10 for the compensation of optical aberrations.

As already described in the introduction, depending on the production process then, the piezoelectric layer is typically not perfectly homogeneous, but rather constructed in a kind of "column structure" composed of a multiplicity of crystalline columns. In this case, it is possible to influence or control the mean column diameter in a targeted manner by way of diverse parameters of the fabrication process, in respect of which mention should be made of, in particular, the laser clock frequency set in a laser deposition method, the mirror substrate temperature during the growth process, the configuration of a growth layer present between mirror substrate and piezoelectric layer, and the gas composition within the chamber during coating. In this case, the mean size of the crystalline columns that is ultimately established can be influenced in a targeted manner by one or more of the parameters mentioned above.

Figure 2:
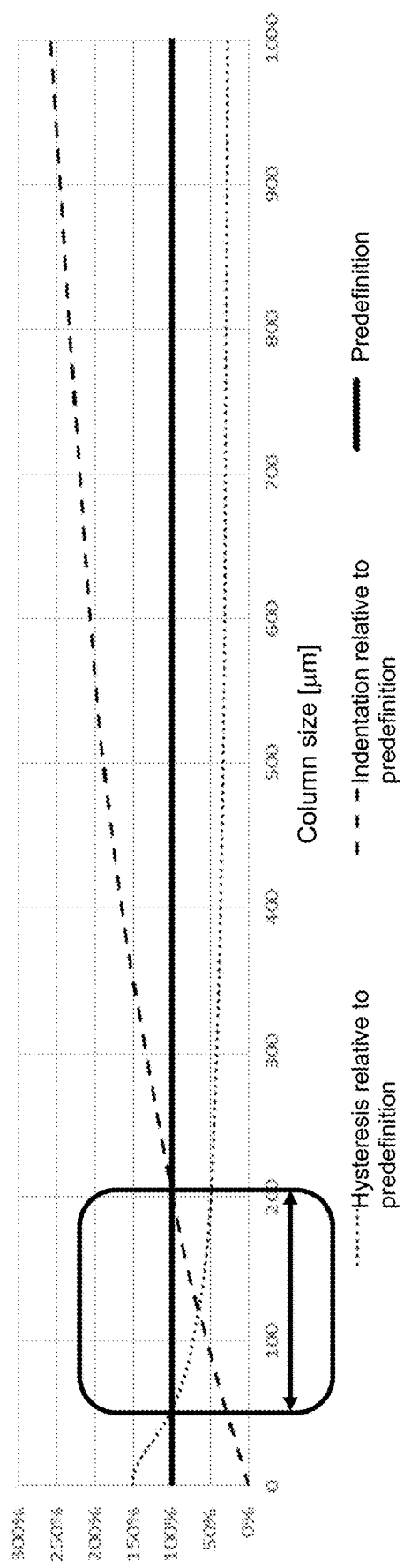
FIG. 2 shows a diagram for explaining a concept that underlies the invention in accordance with one aspect.

According to this aspect of the invention, then, as illustrated schematically in the diagram in FIG. 2, the mean column diameter is influenced so that both the "indentation effect", which increases as the mean column diameter increases, and the hysteresis effect, which decreases as the mean column diameter increases, are taken into account.

In this respect, exemplary qualitative profiles both with regard to the dependence of the hysteresis effect on the mean column diameter (dotted curve) and with regard to the dependence of the indentation effect on the mean column diameter (dashed curve) are illustrated in the diagram in FIG. 2. As indicated in FIG. 2, the targeted setting according to the invention of the mean column diameter in the marked value interval has the consequence that both effects (i.e. both the hysteresis effect and the indentation effect) lie below a threshold value predefined by the respective specification.

Figure 3:
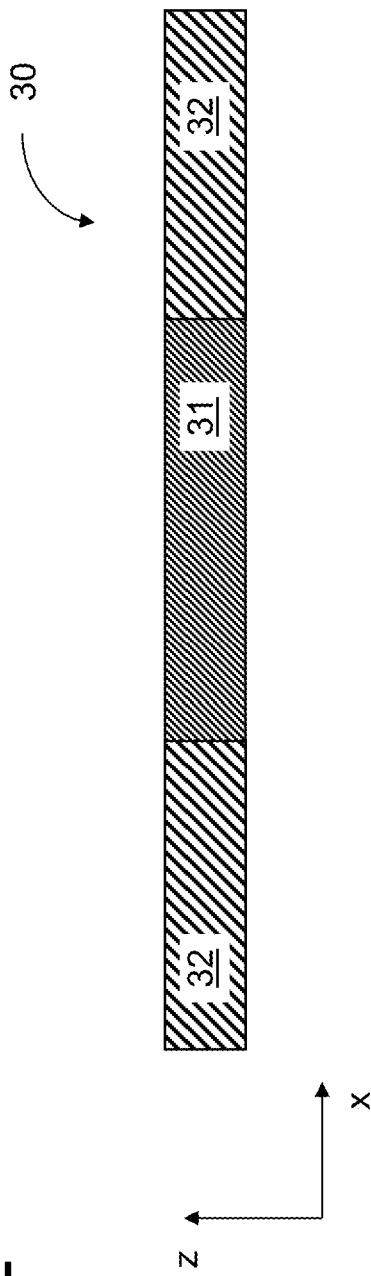
FIG. 3 shows a schematic simplified illustration for describing a possible configuration of a piezoelectric layer present in an adaptive mirror, said piezoelectric layer having, in a radially outer edge, a larger mean column diameter compared with a region that is situated radially further inward.
Figure 4:
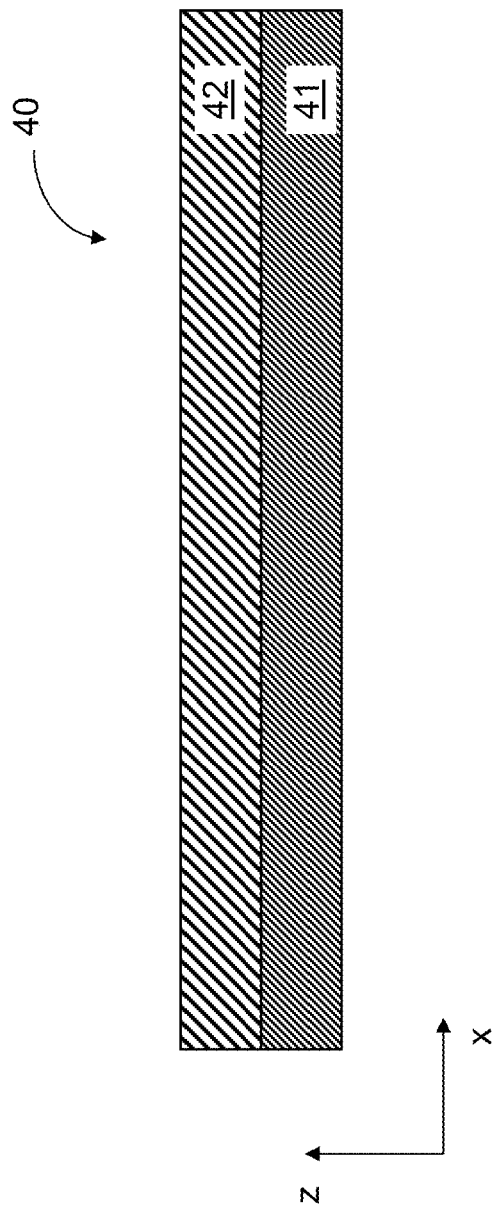
FIG. 4 shows a schematic simplified illustration for describing a further possible configuration of a piezoelectric layer present in an adaptive mirror, said piezoelectric layer having different layer plies with different mean column diameters.

FIG. 3 and FIG. 4 show schematic and greatly simplified illustrations for explaining further possible configurations of a piezoelectric layer present in an adaptive mirror according to the invention, wherein different regions of the piezoelectric layer are present in these embodiments, which regions differ from one another significantly (in particular by at least 40%, more particularly by at least 50%) with regard to the mean column diameter. This can take account of the circumstance that, depending on the specific embodiment of the adaptive mirror, regions may be present in which e.g. the above-described "indentation effect" is less critical (for instance on account of a stronger mechanical support of the mirror substrate in the relevant region), and so in such regions the mean column diameter can be chosen to be larger in favor of reducing the hysteresis effect and thus increasing the setting accuracy. In this regard, in the exemplary scenario in FIG. 3, a piezoelectric layer 30 has, in a radially outer edge region of the piezoelectric layer 30 or of the adaptive mirror, a region 32 having a larger mean column diameter in comparison with a first region 31 situated radially further inward.

In accordance with FIG. 4, the abovementioned regions of a piezoelectric layer 40 having different mean column diameters correspond to different layer plies of the piezoelectric layer, wherein, in the exemplary embodiment illustrated, the first layer ply 41, which is arranged closer to the mirror substrate than is the second layer ply 42, becomes relatively flexible on account of a comparatively smaller mean column diameter and thus reduces the mechanical coupling in the direction of the layer stack between the second layer ply 42 and the mirror substrate (not illustrated). As a result, in this way in the case of the configuration in FIG. 4, firstly, the "indentation effect" described above is alleviated and, secondly, a reduced hysteresis contribution is achieved by way of the second layer ply on account of the smaller number of column boundaries there.

In accordance with a further aspect of the present invention, in addition or as an alternative to the setting of the mean column diameter within the piezoelectric layer as described above with reference to FIGS. 2-4, one or more further suitable measures are implemented in order to reduce the above-described hysteresis contribution of the piezoelectric layer and thus to increase the setting accuracy achieved with the adaptive mirror.

A first of these measures comprises the model-based prediction of the hysteresis, wherein the results obtained in the course of this prediction are integrated from the outset into the actuating travels realized in each case in the adaptive mirror, in order to achieve, as a result, an increased actuating accuracy. In this case, in particular on the basis of a measurement of the hysteresis behavior of the component (i.e. of the adaptive mirror or of the piezoelectric layer), characteristic parameters can be determined and processed in corresponding models, wherein models suitable for the hysteresis prediction (without the invention being restricted thereto) are e.g. the Preisach model, the Prandtl-Ishlinskii model, the Duhem model, the Bouc-Wen model, the Coleman-Hodgdon model and the Jiles-Atherton model.

In further embodiments, the expected hysteresis contribution can also be implemented on the basis of a measurement of the electrical permittivity of the piezoelectric layer in order once again to achieve at least partial compensation of the hysteresis contribution by a modified voltage distribution being correspondingly applied to the electrode arrangements. In this case, the invention makes use of a linear relationship between the piezoelectric expansion, on the one hand, and the permittivity change, on the other hand, wherein in this respect reference is made to the publication Y. Ishikiriyama "Improvement of Self-sensing Piezoelectric Actuator Control Using Permittivity Change Detection", Journal of Advanced Mechanical Design, Systems and Manufacturing, Volume 4, No. 1, 2010, pages 143-149.

In further embodiments, an electrical bias voltage can be applied to the respective electrode arrangement. This makes it possible to achieve an alignment of the so-called Weiss domains before the adaptive mirror is actually started up, and thus a reduction of the hysteresis effect.

Such a "bias voltage" can be applied before the operation of the adaptive mirror according to the invention or in operating pauses. Furthermore, in accordance with FIG. 5, such a "bias voltage" can also be maintained continuously during operation of the adaptive mirror. Furthermore, an alignment of the Weiss domains and thus a reduction of the hysteresis effect can also be achieved by a "bias voltage" being applied to the piezoelectric layer during the production thereof in the cooling step.

Figure 5:
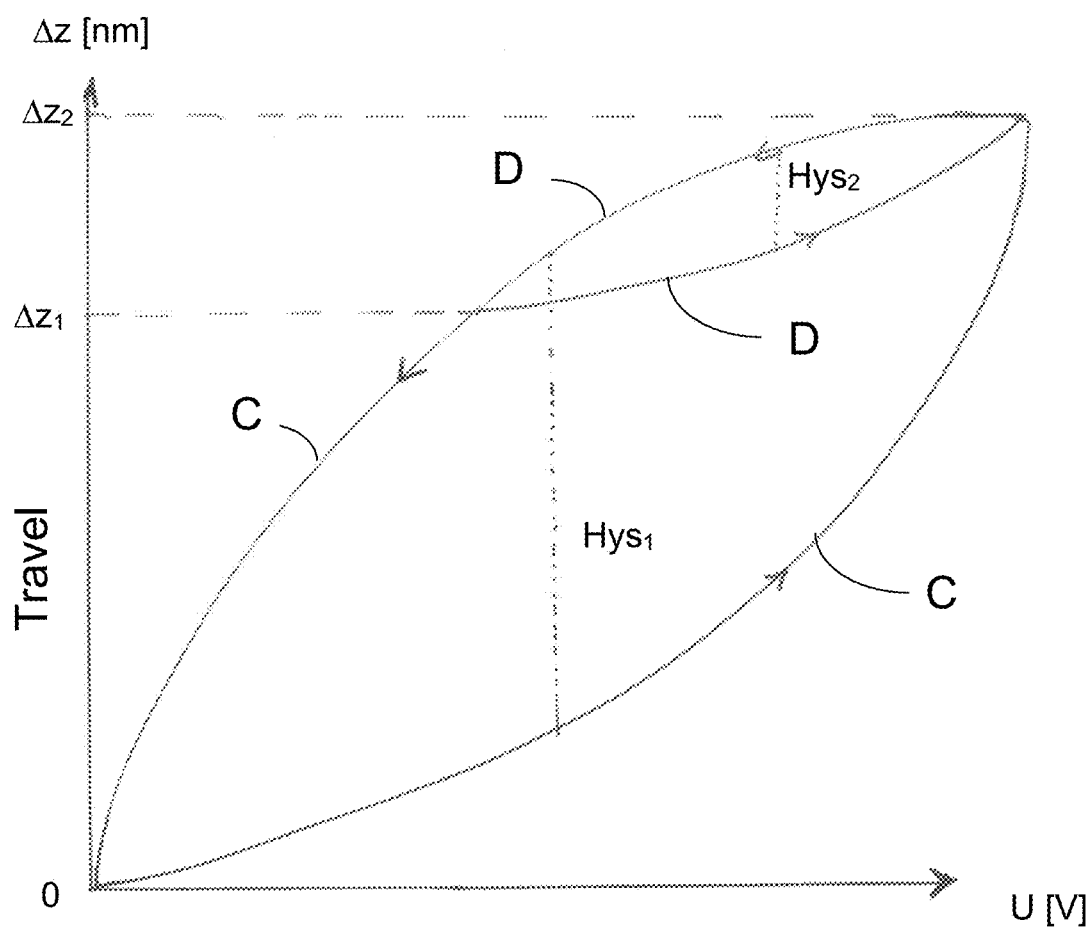
FIG. 5 shows a diagram for explaining a further concept that underlies the invention.

The set values of the electrical bias voltage may in particular exceed the voltage values actually used for actuation. As indicated in FIG. 5, an "operating point" that is improved with regard to the undesired hysteresis effect could also be chosen by applying a suitable electrical voltage. In this regard, merely by way of example, in accordance with FIG. 5, by changing from the voltage range in accordance with curve "C" to the voltage range in accordance with curve "D" what can be achieved is that, with the nonlinear curve profile being utilized, the reduction of hysteresis exceeds the likewise obtained effect of the decrease in travel, thus in other words there occurs "effectively less hysteresis deviation per set nanometer of surface deformation".

In the interaction of "bias voltage" and deformation-effective, variable actuating voltage it is possible to design the variable voltage portion to be between 0 V and a predefined maximum value. Alternatively, the design can be effected such that the variable voltage is between predefined minimum and maximum values (different than zero) or else such that its maximum value is 0 V and it is in the negative voltage range. For example, the "bias voltage" can be 50 V and the variable voltage can vary between 0 V and 50 V. As an alternative thereto, the bias voltage can be chosen to be 70 V and the variable voltage can be between −20 V and +30 V. Furthermore, in this example, the bias voltage can be 100 V and the variable voltage can be between −50 V and 0 V.

In FIG. 5 each of these situations could describe operation in the range bounded by the curves designated by D. The difference is that a comparatively high "bias voltage" maintains a strong polarization of the domains or Weiss domains constantly, that is to say including in the operating pauses. However, it is possible that a constantly high voltage places higher demands on the insulation of the structures. The operating point is chosen depending on which aspect is more important in the specific application. There is the possibility of adapting the complete operating range (that is to say in FIG. 5 the region bounded by the curves D) and also the respective choice of the "bias voltage" to the present operating conditions. In this regard, if the amplitude required is small, the main emphasis can be put on low hysteresis and thus high accuracy, such that a comparatively high "bias voltage" tends to be employed. By contrast, if there is a need for large travels in conjunction with reduced accuracy requirements, a comparatively low "bias voltage" is chosen.

In further embodiments, a unipolar alternating electric field for aligning the Weiss domains can be applied before the adaptive mirror is started up and/or in operating pauses. The frequency of said unipolar alternating electric field can be e.g. in an interval of 1 MHz to 100 MHz.

Figure 6:
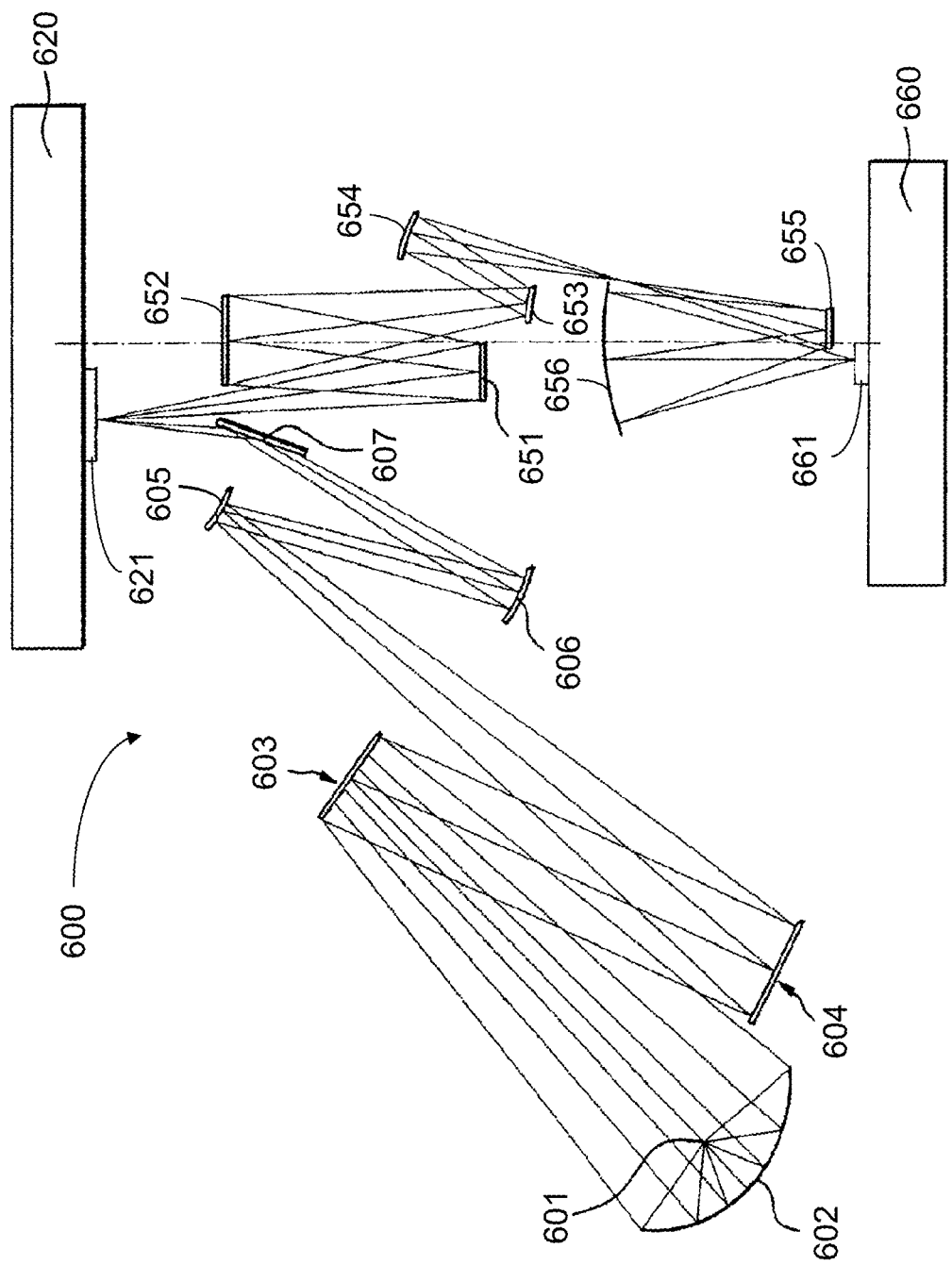
FIG. 6 shows a schematic illustration for describing the possible construction of a microlithographic projection exposure apparatus designed for operation in the EUV.
Figure 7A:
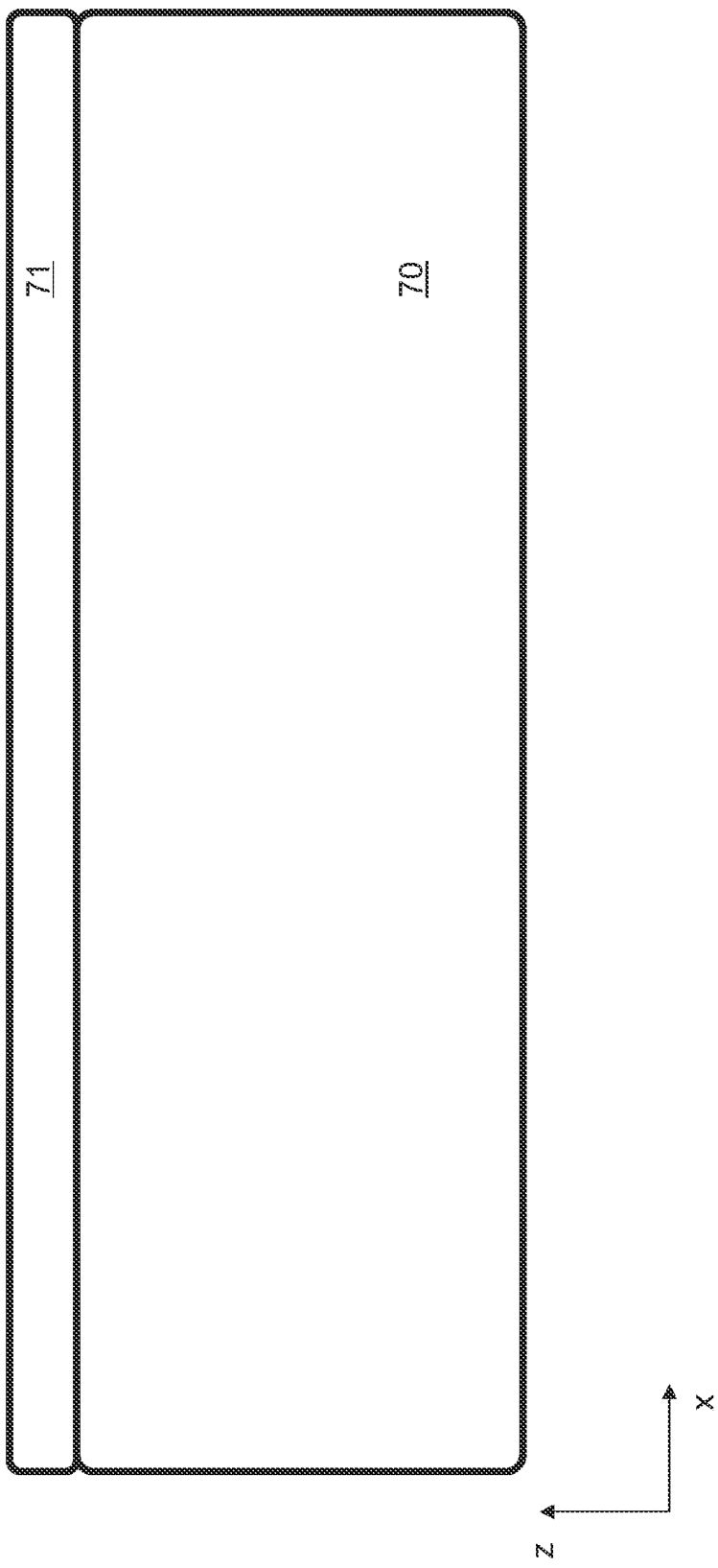
FIG. 7A shows a schematic simplified illustration of a conventional adaptive mirror having a mirror substrate and a piezoelectric layer.
Figure 7B:
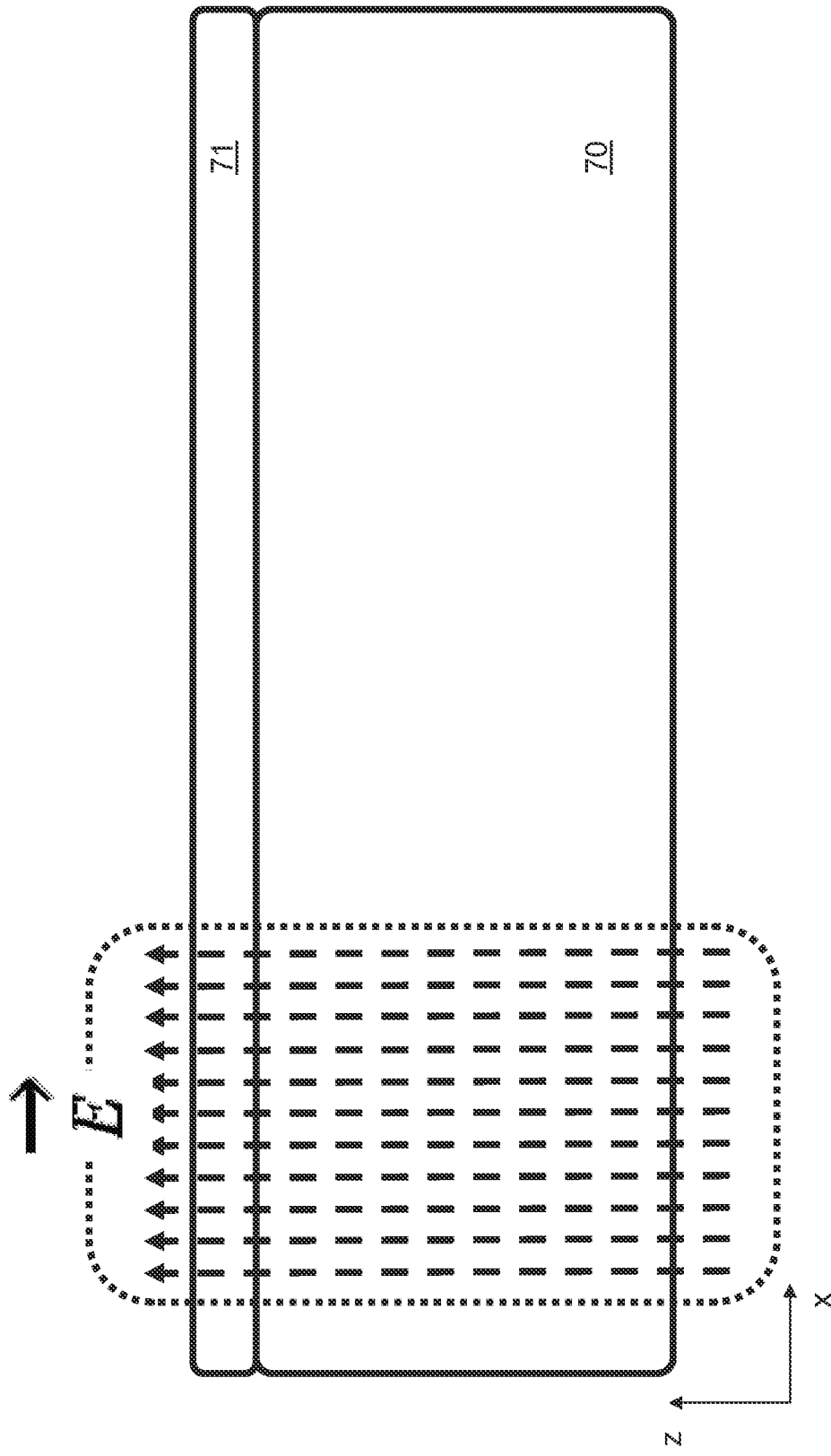
FIG. 7B shows a schematic illustration of application of an electric field to the adaptive mirror of FIG. 7A.
Figure 7E:
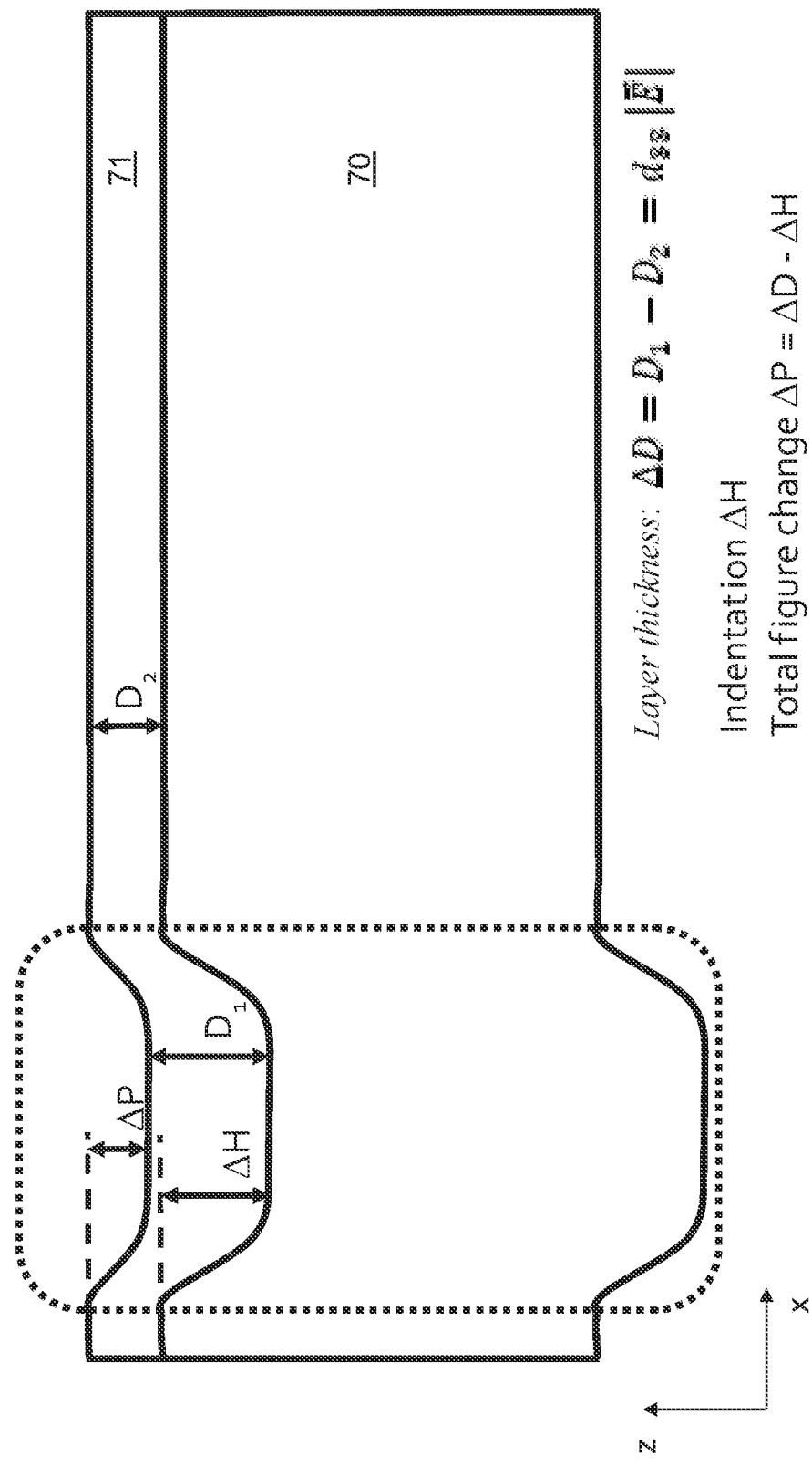
FIG. 7E shows a schematic illustration of an indentation of the piezoelectric layer into the mirror substrate in the adaptive mirror of FIG. 7A.

FIG. 6 shows a schematic illustration of an exemplary projection exposure apparatus which is designed for operation in the EUV and in which the present invention can be realized.

According to FIG. 6, an illumination device in a projection exposure apparatus 600 designed for EUV comprises a field facet mirror 603 and a pupil facet mirror 604. The light from a light source unit comprising a plasma light source 601 and a collector mirror 602 is directed onto the field facet mirror 603. A first telescope mirror 605 and a second telescope mirror 606 are arranged in the light path downstream of the pupil facet mirror 604. A deflection mirror 607 is arranged downstream in the light path, said deflection mirror directing the radiation that is incident thereon at an object field in the object plane of a projection lens comprising six mirrors 651-656. At the location of the object field, a reflective structure-bearing mask 621 is arranged on a mask stage 620, said mask being imaged with the aid of the projection lens into an image plane in which a substrate 661 coated with a light-sensitive layer (photoresist) is situated on a wafer stage 660.

Of the mirrors 651-656 of the projection lens, merely by way of example the mirrors 651 and 652—arranged in the initial area of the projection lens with respect to the optical beam path—can be configured in the manner according to the invention. This is the case because the achieved effect of compensating for thermal deformations is particularly noticeable with these mirrors 651, 652, as a result of the still comparatively low summed reflection losses, and the thus relatively high light intensities, at these mirrors.

Even though the invention has been described on the basis of specific embodiments, numerous variations and alternative embodiments will be apparent to the person skilled in the art, for example through combination and/or exchange of features of individual embodiments. Accordingly, such variations and alternative embodiments are also encompassed by the present invention, and the scope of the invention is restricted only within the meaning of the appended patent claims and equivalents thereof.

What is claimed is:

1. A mirror for a microlithographic projection exposure apparatus, having an optical effective surface, comprising
   a mirror substrate;
   a reflection layer stack that reflects electromagnetic radiation incident on the optical effective surface;
   at least one piezoelectric layer arranged between the mirror substrate and the reflection layer stack; and
   a first electrode arrangement situated on a side of the piezoelectric layer facing the reflection layer stack, and a second electrode arrangement situated on a side of the piezoelectric layer facing the mirror substrate;
   wherein the first electrode arrangement and the second electrode arrangement are arranged to apply an electric field to the piezoelectric layer that produces a locally variable deformation in the piezoelectric layer;
   wherein the piezoelectric layer has a plurality of columns spatially separated from one another by column boundaries;
   wherein a mean column diameter of the columns is in a range of 0.1 µm to 50 µm; and
   wherein a ratio between the mean column diameter and a height of the columns is in a range of 50:1 to 1:200.

2. A mirror for a microlithographic projection exposure apparatus, having an optical effective surface, comprising
   a mirror substrate;
   a reflection layer stack that reflects electromagnetic radiation incident on the optical effective surface;
   at least one piezoelectric layer arranged between the mirror substrate and the reflection layer stack; and
   a first electrode arrangement situated on a side of the piezoelectric layer facing the reflection layer stack, and a second electrode arrangement situated on a side of the piezoelectric layer facing the mirror substrate;
   wherein the first electrode arrangement and the second electrode arrangement are arranged to apply an electric field to the piezoelectric layer that produces a locally variable deformation in the piezoelectric layer;

wherein the piezoelectric layer has a plurality of columns spatially separated from one another by column boundaries; and wherein a mean column spacing of adjacent columns is in a range of 2% to 30% of a mean column diameter of the columns.

3. The mirror as claimed in claim 2, wherein a ratio between the mean column diameter and a height of the columns is in a range of 50:1 to 1:200.

4. The mirror as claimed in claim 1, wherein the piezoelectric layer has at least two regions which differ from one another by at least 30% with regard to the mean column diameter.

5. A mirror for a microlithographic projection exposure apparatus, having an optical effective surface, comprising
a mirror substrate;
a reflection layer stack that reflects electromagnetic radiation incident on the optical effective surface;
at least one piezoelectric layer arranged between the mirror substrate and the reflection layer stack; and
a first electrode arrangement situated on a side of the piezoelectric layer facing the reflection layer stack, and a second electrode arrangement situated on a side of the piezoelectric layer facing the mirror substrate;
wherein the first electrode arrangement and the second electrode arrangement are arranged to apply an electric field to the piezoelectric layer that produces a locally variable deformation in the piezoelectric layer;
wherein the piezoelectric layer has a plurality of columns spatially separated from one another by column boundaries; and
wherein the piezoelectric layer has at least two regions which differ from one another by at least 30% with regard to a mean column diameter of the columns.

6. The mirror as claimed in claim 5, wherein the piezoelectric layer has at least two regions which differ from one another by at least 40% with regard to the mean column diameter.

7. The mirror as claimed in claim 5, wherein the two regions correspond to different layer plies of the piezoelectric layer, wherein a first layer ply of the layer plies is arranged closer to the mirror substrate than a second layer ply of the layer plies.

8. The mirror as claimed in claim 7, wherein the first layer ply has the region with a smaller of the mean column diameters.

9. The mirror as claimed in claim 5, wherein the two regions are regions which are situated within a same one of the layer plies of the piezoelectric layer and which are laterally separated from one another.

10. The mirror as claimed in claim 5, wherein the piezoelectric layer has at least two regions which differ from one another by at least 10% with regard to a mean column spacing of adjacent columns.

11. The mirror as claimed in claim 1 and configured for an operating wavelength of less than 30 nm.

12. The mirror as claimed in claim 1 and configured for a microlithographic projection exposure apparatus.

13. An optical system configured as an illumination system of a microlithographic projection exposure apparatus comprising an optical system that comprises a mirror as claimed in claim 1.

14. A projection lens of a microlithographic projection exposure apparatus comprising an optical system that comprises a mirror as claimed in claim 1.

15. A microlithographic projection exposure apparatus comprising an illumination device and a projection lens, wherein at least one of the illumination system and the projection lens comprises an optical system as claimed in claim 1.

* * * * *

UNITED STATES PATENT AND TRADEMARK OFFICE
CERTIFICATE OF CORRECTION

PATENT NO. : 11,187,990 B2
APPLICATION NO. : 17/158083
DATED : November 30, 2021
INVENTOR(S) : Lippert et al.

It is certified that error appears in the above-identified patent and that said Letters Patent is hereby corrected as shown below:

On the Title Page

Page 2, Column 2, item (56) in Line 6 of OTHER PUBLICATIONS, delete "Tifanate" and insert -- Titanate --.

Page 2, Column 2, item (56) in Line 9 of OTHER PUBLICATIONS, delete "collrol" and insert -- control --.

Page 2, Column 2, item (56) in Line 10 of OTHER PUBLICATIONS, delete "Electroinics" and insert -- Electronics --.

In the Claims

Column 14, Line 35, in Claim 15, delete "claim 1" and insert -- claim 13 --.

Signed and Sealed this
Thirteenth Day of September, 2022

Katherine Kelly Vidal
*Director of the United States Patent and Trademark Office*